(12) United States Patent
Bang

(10) Patent No.: US 11,587,806 B2
(45) Date of Patent: Feb. 21, 2023

(54) TEMPERATURE CONTROL DEVICE FOR CHEMICAL LIQUID USED IN SEMICONDUCTOR MANUFACTURING PROCESS

(71) Applicant: Min Cheol Bang, Hwaseong-si (KR)

(72) Inventor: Min Cheol Bang, Hwaseong-si (KR)

( * ) Notice: Subject to any disclaimer, the term of this patent is extended or adjusted under 35 U.S.C. 154(b) by 201 days.

(21) Appl. No.: 17/098,249

(22) Filed: Nov. 13, 2020

(65) Prior Publication Data

US 2021/0151337 A1 May 20, 2021

(30) Foreign Application Priority Data

Nov. 15, 2019 (KR) .......................... 10-2019-0146443

(51) Int. Cl.
*H01L 21/67* (2006.01)
*H01L 35/02* (2006.01)

(52) U.S. Cl.
CPC .... *H01L 21/67248* (2013.01); *H01L 21/6715* (2013.01); *H01L 21/67109* (2013.01); *H01L 35/02* (2013.01)

(58) Field of Classification Search
CPC ......... H01L 21/67248; H01L 21/67109; H01L 21/6715; H01L 35/02; H01L 21/67028; H01L 21/67098
See application file for complete search history.

(56) References Cited

U.S. PATENT DOCUMENTS

| 2004/0025516 A1* | 2/2004 | Van Winkle ............ F25B 21/04 62/3.61 |
| 2012/0279233 A1* | 11/2012 | Chainer ............. H05K 7/20254 62/3.6 |
| 2017/0105313 A1* | 4/2017 | Shedd ................ H05K 7/20809 |

FOREIGN PATENT DOCUMENTS

| KR | 2021082402 A * | 7/2021 | ....... H01L 21/67017 |
| WO | WO-2016069271 A1 * | 5/2016 | ............ F25B 23/006 |

* cited by examiner

*Primary Examiner* — Mohammed Shamsuzzaman
(74) *Attorney, Agent, or Firm* — Lex IP Meister, PLLC

(57) ABSTRACT

The present invention relates to a temperature control device for a chemical liquid used in a semiconductor manufacturing process, which is located on a chemical liquid circulating and supplying tube to control a temperature of the chemical liquid. The device includes: a first heat sink having a cooling water flow path formed therein; a plurality of thermoelectric modules coming into contact with both side surfaces of the first heat sink, respectively; and a second heat sink coming into contact with the thermoelectric modules, while placing the first heat sink between the thermoelectric modules, and having a plurality of chemical liquid flow path tubes adapted to flow the chemical liquid therealong.

7 Claims, 9 Drawing Sheets

【FIG. 1】 Prior Art
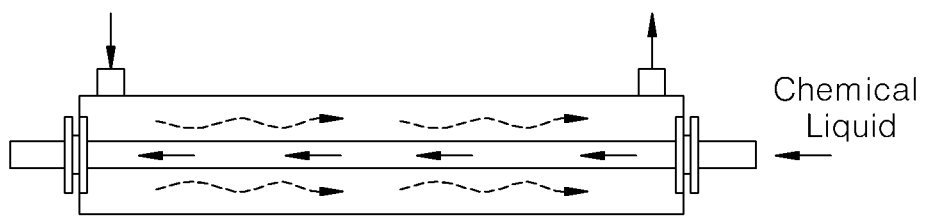
【FIG. 2A】 Prior Art
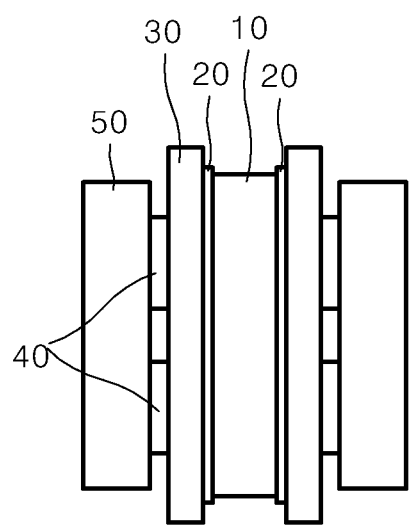

【FIG. 2B】 Prior Art
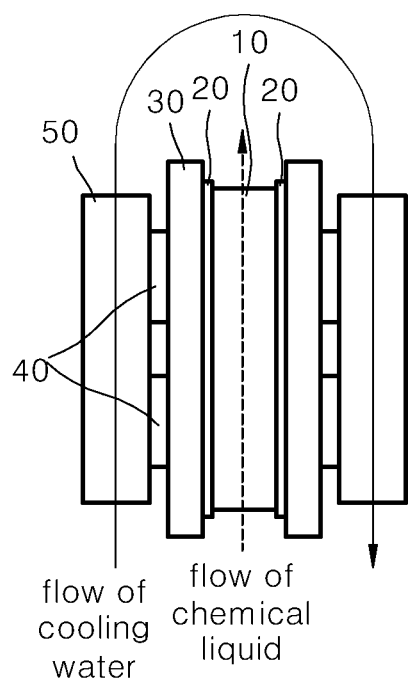
【FIG. 3】
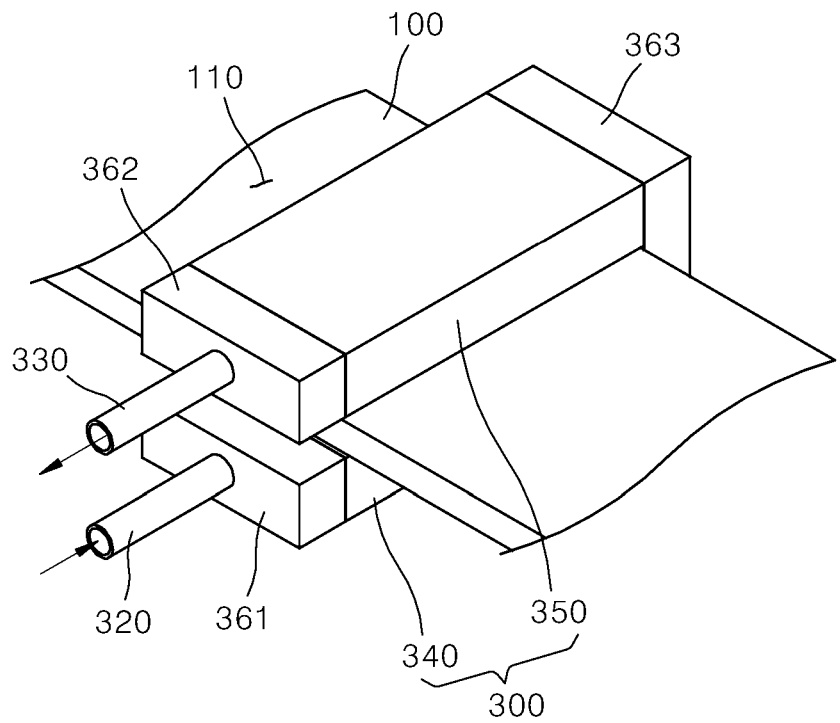

【FIG. 4】
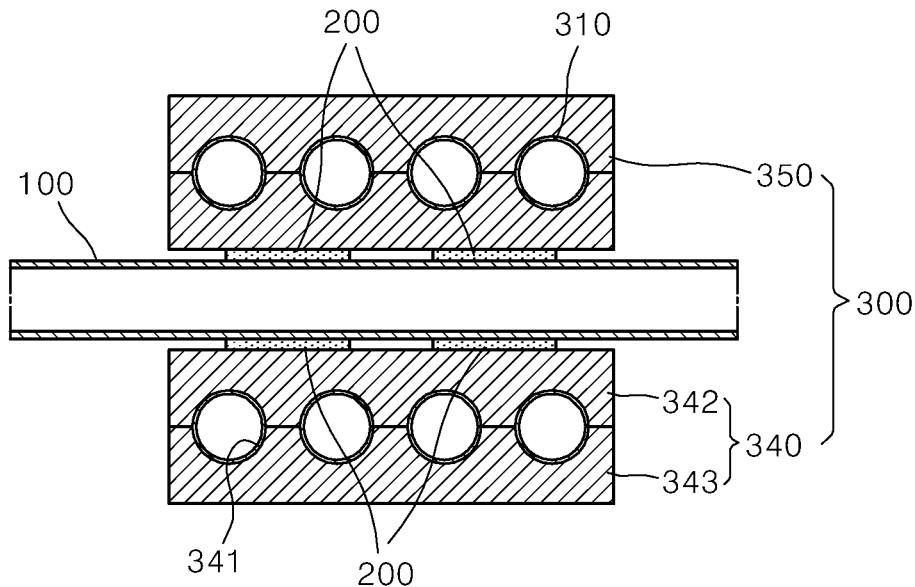
【FIG. 5】
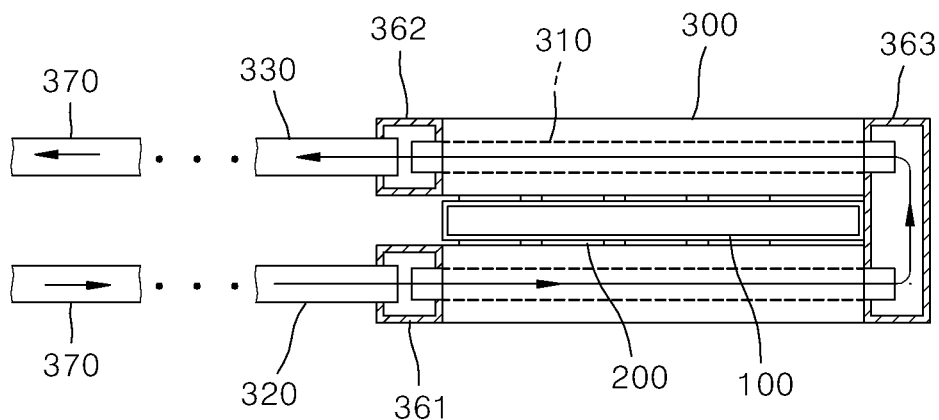
【FIG. 6A】
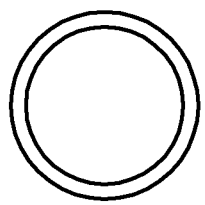

【FIG. 6B】
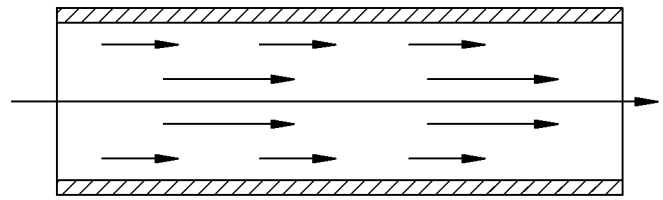
【FIG. 7】
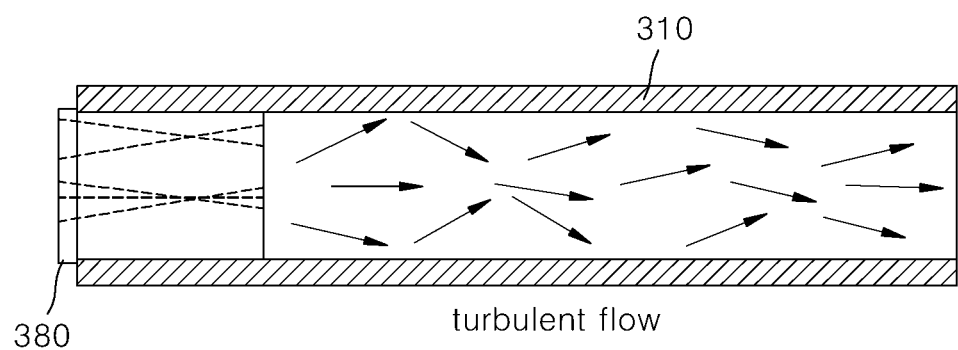
turbulent flow
【FIG. 8A】
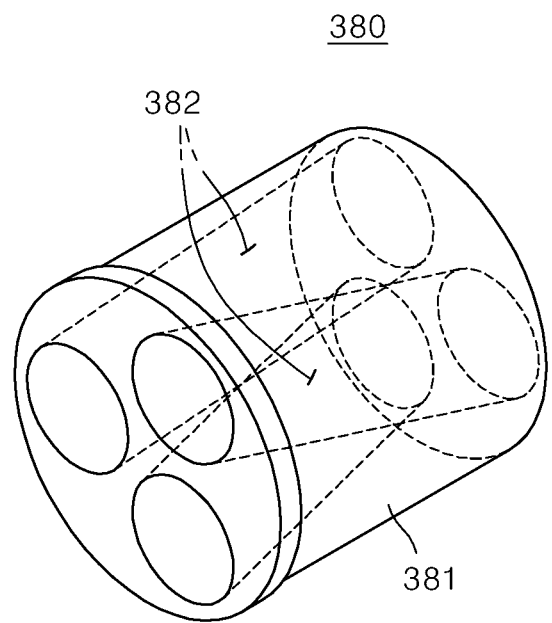

【FIG. 8B】
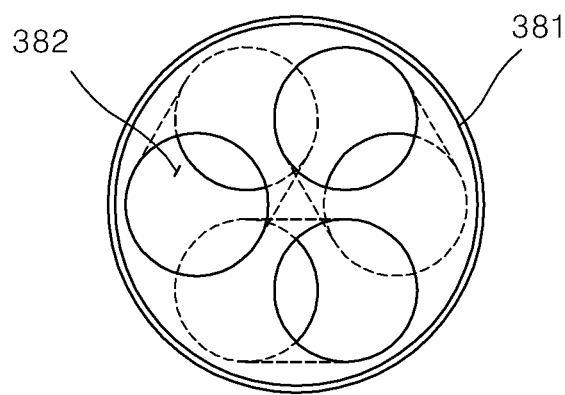

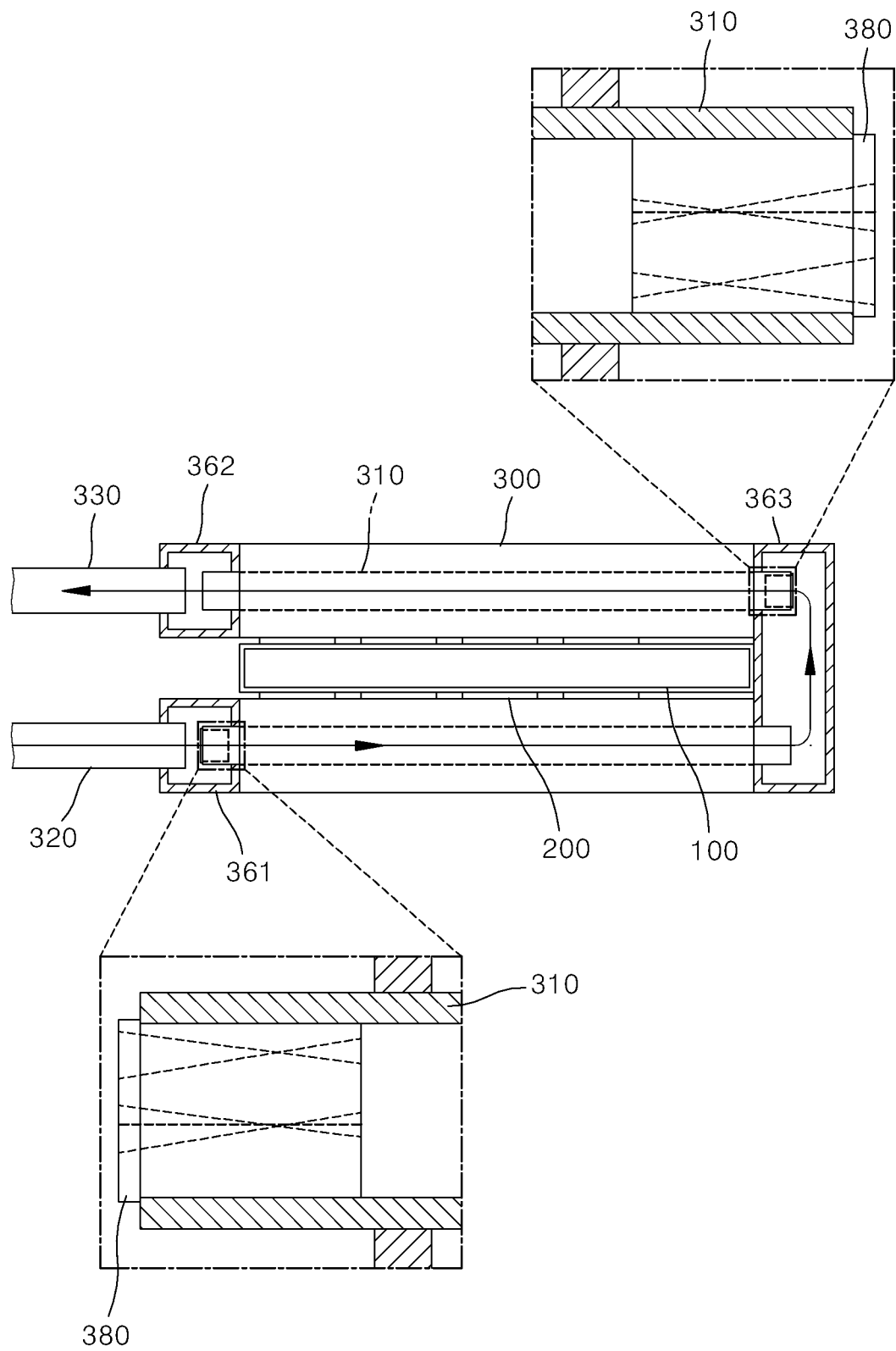
[FIG. 9]

【FIG. 10A】
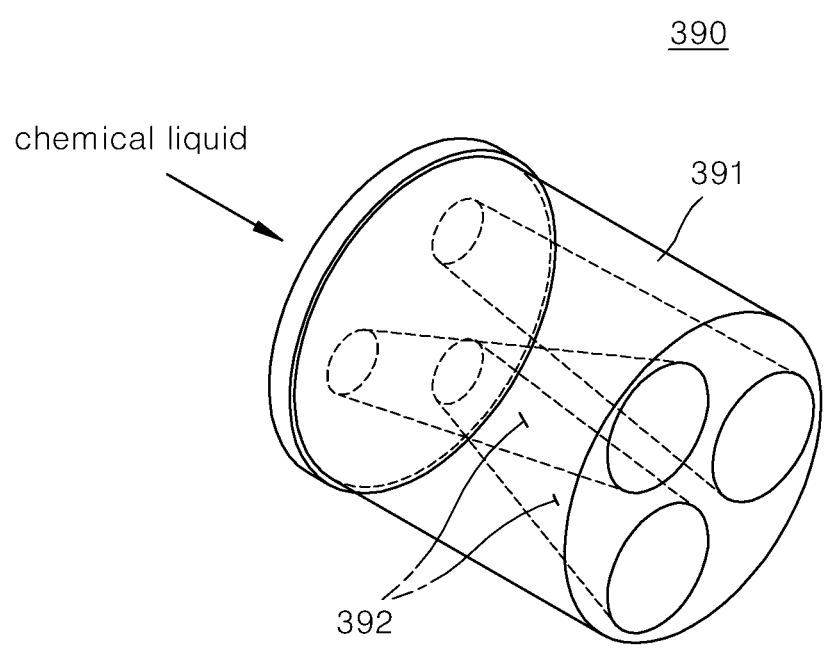
【FIG. 10B】
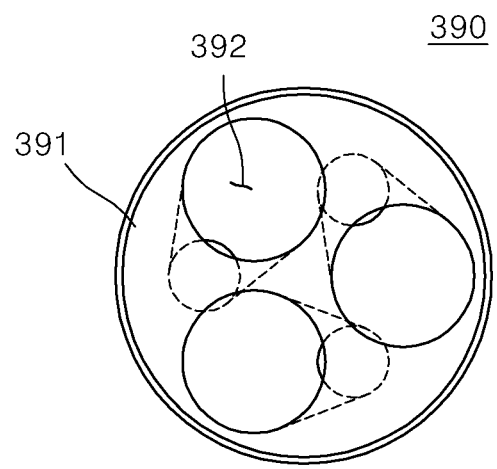

【FIG. 11A】
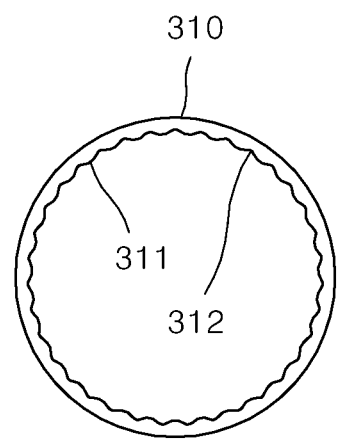
【FIG. 11B】
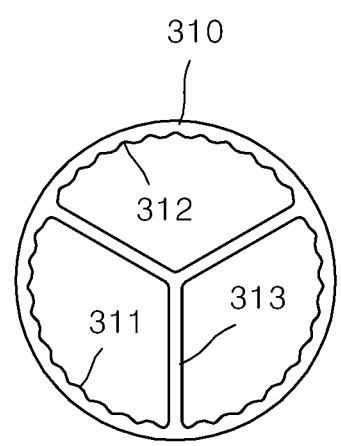

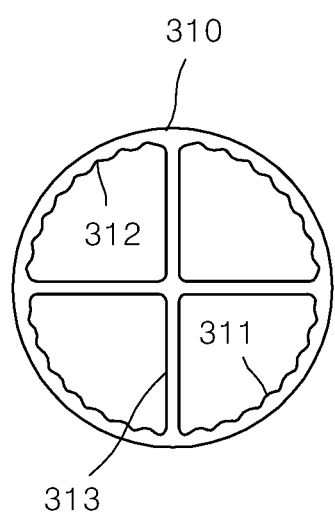
[FIG. 11C]

TEMPERATURE CONTROL DEVICE FOR CHEMICAL LIQUID USED IN SEMICONDUCTOR MANUFACTURING PROCESS

CROSS REFERENCE TO RELATED APPLICATION OF THE INVENTION

The present application claims the benefit of Korean Patent Application No. 10-2019-0146443 filed in the Korean Intellectual Property Office on Nov. 15, 2019, the entire contents of which are incorporated herein by reference.

BACKGROUND OF THE INVENTION

Field of the Invention

The present invention relates to a temperature control device for a chemical liquid used in a semiconductor manufacturing process that has an improvement in a heat transfer structure to thus allow heat generated from a heat generating source to be more efficiently transferred to the chemical liquid.

Background of the Related Art

Generally, a substrate processing apparatus, which performs a semiconductor manufacturing process and a liquid crystal display (LCD) manufacturing process, makes use of various chemical liquids for a substrate manufacturing process.

For example, the substrate processing apparatus performs etching and cleaning for a substrate, and in such substrate manufacturing process are used various kinds of chemical liquids like acidic solutions such as hydrofluoric acid, sulfuric acid, nitric acid, phosphoric acid, etc., alkaline solutions such as potassium hydroxide, sodium hydroxide, ammonium, etc., or any one of them or a mixture of them.

Through various kinds of chemical liquids, chemical reactions occur to eliminate materials unnecessary from the substrate or to clean the substrate. In this case, a temperature of the chemical liquid applied to the substrate has an important role in the substrate manufacturing process. So as to obtain the uniformity and efficiency in the substrate manufacturing process, accordingly, it is necessary to constantly hold a temperature of the chemical liquid and to stably supply the chemical liquid during the etching or cleaning process.

One of conventional devices for controlling a temperature of a chemical liquid is suggested in FIG. 1.

As shown in FIG. 1, a double tube type module is provided to have an outer tube with cooling water introduced into one side thereof and discharged from the other side thereof and a chemical liquid tube located inside the outer tube to flow a chemical liquid therealong. According to the conventional double tube type module, bulky devices like a heater, a cooling device, and so on are required to control the temperature of the chemical liquid, and also, it is hard to induce fast changes in the temperature of the chemical liquid.

So as to solve such problems, another conventional device as shown in FIGS. 2A and 2B is suggested.

As shown in FIGS. 2A and 2B, the conventional device includes a chemical liquid jacket 10 along which a chemical liquid flows, silicon carbide (SiC) sheets 20 located on both sides of the chemical liquid jacket 10, aluminum plates 30 located on the outer surfaces of the silicon carbide sheets 20, thermoelectric modules 40 located on the outer surfaces of the aluminum plates 30, and heat sinks 50 located on the outermost sides thereof and having cooling water flow paths.

Through such a configuration, heat transfer is applied to the thermoelectric modules 40, the aluminum plates 30, the high purity silicon carbide sheets 20, and the chemical liquid in the order mentioned. The thermoelectric modules 40 electrically connect n-type and p-type thermoelectric semiconductors in series and thermally connect them in parallel with each other, and through changes in a current application direction, heat generated in the n-type and p-type thermoelectric semiconductors can become a high or low temperature quickly. Further, the silicon carbide (SiC) has excellent properties such as good heat resistance and high thermal conductivity, and accordingly, the silicon carbide (SiC) sheets 20 advantageously transfer the heat generated from the thermoelectric modules 40 to the chemical liquid efficiently, without any heat loss.

If impurities are produced by the chemical reactions between the chemical liquid and the components around the chemical liquid, further, various defects may occur in the semiconductor manufacturing process, and in this case, the silicon carbide (SiC) sheets 20 do not have any proved chemical resistance. If the silicon carbide (SiC) sheets 20 are used, however, defects often occur due to the generation of impurities. The use of the silicon carbide (SiC) sheets whose chemical resistance is not proved in controlling the temperature of the chemical liquid may cause serious dangers and have many difficulties in manufacturing products.

Further, the chemical liquid jacket 10 is made of perfluoroalkoxy (PFA) whose chemical resistance is proved against high temperature available (allowed for flowing the chemical liquid) and the direct contact with the chemical liquid, but the chemical liquid jacket 10 has low heat transfer efficiency according to the properties of the material. If the chemical liquid jacket 10 has the shape of a straight tube, especially, a flow of the chemical liquid becomes laminar, thereby making it hard to ensure high heat exchange efficiency.

SUMMARY OF THE INVENTION

Accordingly, the present invention has been made in view of the above-mentioned problems occurring in the related art, and it is an object of the present invention to provide a temperature control device for a chemical liquid used in a semiconductor manufacturing process that is capable of being configured to allow heat transfer efficiency to the chemical liquid to be raised, without having the silicon carbide (SiC) sheets used in the conventional practice, thereby efficiently controlling a temperature of the chemical liquid.

To accomplish the above-mentioned object, according to the present invention, there is provided a temperature control device for a chemical liquid used in a semiconductor manufacturing process, which is located on a chemical liquid circulating and supplying tube to control a temperature of the chemical liquid, the device including: a first heat sink having a cooling water flow path formed therein; a plurality of thermoelectric modules coming into contact with both side surfaces of the first heat sink, respectively; and a second heat sink coming into contact with the thermoelectric modules, while placing the first heat sink between the thermoelectric modules, and having a plurality of chemical liquid flow path tubes adapted to flow the chemical liquid therealong.

According to the present invention, desirably, the second heat sink includes: a chemical liquid inlet tube adapted to introduce the chemical liquid thereinto and a chemical liquid outlet tube adapted to discharge the chemical liquid therefrom; first and second heat sink blocks located on one side and the other side of the first heat sink and having the plurality of chemical liquid flow path tubes located at the insides thereof in such a manner as to communicate with the chemical liquid inlet tube and the chemical liquid outlet tube; first and second manifold blocks located on one side of the first and second heat sink blocks, having internal flowing space therein to accommodate the chemical liquid supplied to or discharged from the chemical liquid flow path tubes thereinto, and communicating with the chemical liquid inlet tube and the chemical liquid outlet tube; and a third manifold block located on the other side of the first and second heat sink blocks, having an internal flowing space therein, and allowing the plurality of chemical liquid flow path tubes arranged on the first and second heat sink blocks to communicate with one another.

According to the present invention, desirably, the plurality of chemical liquid flow path tubes are made of perfluoroalkoxy (PFA), the first and second heat sinks are made of an aluminum alloy, and the first to third manifold blocks are made of polytetrafluoroethylene (PTFE).

According to the present invention, desirably, the second heat sink further includes turbulent flow generating blocks inserted into the end peripheries of the plurality of chemical liquid flow path tubes to generate turbulent flows in the chemical liquid of the plurality of chemical liquid flow path tubes.

According to the present invention, desirably, the plurality of chemical liquid flow path tubes have the shape of a straight tube, and each turbulent flow generating block includes: a turbulent flow generating block body; and a plurality of turbulent flow inducing paths formed on the turbulent flow generating block body in such a manner as to be inclined with respect to a longitudinal center axis of each chemical liquid flow path tube to allow the chemical liquid to flow toward the inner peripheral surface of the chemical liquid flow path tube to thus induce the turbulent flows caused by the collision with the inner peripheral surfaces of the chemical liquid flow path tube.

According to the present invention, desirably, the plurality of chemical liquid flow path tubes have the shape of a straight tube, and each turbulent flow generating block includes: a turbulent flow generating block body; and a plurality of turbulent flow inducing paths formed on the turbulent flow generating block body in such a manner as to be gradually increased in a sectional area thereof toward the inner side of each chemical liquid flow path tube to allow the chemical liquid to flow toward the inner peripheral surface of the chemical liquid flow path tube to thus induce the turbulent flows caused by the collision with the inner peripheral surfaces of the chemical liquid flow path tube.

According to the present invention, desirably, the turbulent flow generating blocks are made of PFA or PTFE.

According to the present invention, desirably, each chemical liquid flow path tube has protruding portions and concave portions repeatedly formed on the inner peripheral surface thereof along a circumferential direction thereof in such a manner as to be extended along a longitudinal direction thereof.

According to the present invention, desirably, each chemical liquid flow path tube has a plurality of partitioning bars extendedly formed at the inside thereof along a longitudinal direction thereof in such a manner as to partition the flow path into a plurality of areas.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIGS. 1 to 2B are views showing temperature control devices for a chemical liquid used in a semiconductor manufacturing process in conventional practices;

FIG. 3 is a perspective view showing a temperature control device for a chemical liquid used in a semiconductor manufacturing process according to the present invention;

FIG. 4 is a front sectional view showing the temperature control device of FIG. 3;

FIG. 5 is a side sectional view showing the temperature control device of FIG. 3;

FIGS. 6A and 6B are views showing laminar flows in a straight tube;

FIG. 7 is a sectional view showing a state where a turbulent flow generating block is inserted into an end periphery of a chemical liquid flow path pipe in the temperature control device according to the present invention;

FIGS. 8A and 8B are perspective and front views showing an example of the turbulent flow generating block of FIG. 7;

FIG. 9 is a sectional view showing a state where the turbulent flow generating blocks are inserted into the temperature control device according to the present invention;

FIGS. 10A and 10B are perspective and front views showing another example of the turbulent flow generating block; and FIGS. 11A to 11C are top views showing the chemical liquid flow path tube with various shapes in the temperature control device according to the present invention.

DETAILED DESCRIPTION OF THE EMBODIMENTS

Hereinafter, the present invention will be in detail described with reference to the attached drawings. However, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one of ordinary skill in the art to variously employ the present invention in virtually any appropriately detailed structure. In the drawings, it should be noted that the corresponding parts in the embodiments of the present invention are indicated by corresponding reference numerals.

A temperature control device for a chemical liquid used in a semiconductor manufacturing process according to the present invention is located on a section where the chemical liquid flows in various processes of manufacturing a semiconductor, like wet etching, cleaning, and so on, to hold the chemical liquid at a given temperature constantly when the chemical liquid is heated or cooled, and to do this, the temperature control device is configured to improve heat transfer efficiency to the chemical liquid flowing along an interior of a tube, thereby ensuring excellent temperature control for the chemical liquid.

Hereinafter, an explanation on a temperature control device for a chemical liquid used in a semiconductor manufacturing process according to the present invention will be in detail given with reference to the attached drawings.

As shown in FIGS. 3 to 5, a temperature control device for a chemical liquid used in a semiconductor manufacturing process according to the present invention is located on a chemical liquid circulating and supplying tube 370 to control a temperature of the chemical liquid and includes a first heat sink 100, thermoelectric modules 200, and a second heat sink 300.

The first heat sink 100 has the shape of a general rectangular tube and is provided with a cooling water flow path 110 formed therein to flow processing cooling water (PCW) or other cooling water therealong. If a high temperature is generated on one side surface of the thermoelectric modules 200 coming into contact with the first heat sink 100 through the operations of the thermoelectric modules 200, in this case, the cooling water serves to rapidly cool a portion (heat radiation side surface) where the high temperature is generated and thus to constantly maintain a temperature on the heat radiation side surface, so that cooling/heating efficiency of the thermoelectric modules 200 can be prevented from being lowered to thus improve the durability of the thermoelectric modules 200. So as to allow low temperature heat of the processing cooling water to be efficiently transferred to one side surface of the thermoelectric modules 200 from which high temperature is emitted, like this, the first heat sink 100 and the second heat sink 300 (including first and second heat sink blocks 340 and 350 as will be discussed later) are made of aluminum alloys with high thermal conductivity.

The thermoelectric modules 200 are located to come into contact with both side surfaces of the first heat sink 100 and serve to heat or cool the chemical liquid through control of heat generated therefrom. In detail, a high or low temperature is generated on contacted surfaces of the thermoelectric modules 200 with the second heat sink 300 as will be discussed later, thereby controlling a temperature of the chemical liquid. The thermoelectric modules 200 are arranged uniformly on both side surfaces of the first heat sink 100, respectively.

As shown in FIGS. 4 and 5, the second heat sink 300 comes into contact with the thermoelectric modules 200, while placing the first heat sink 100 between the thermoelectric modules 200, and has a plurality of chemical liquid flow path tubes 310 along which the chemical liquid flows.

On the other hand, the heat generated from the thermoelectric modules 200 is transferred to the second heat sink 300, the chemical liquid flow path tubes 310, and the chemical liquid in the order mentioned, thereby causing the change in the temperature of the chemical liquid. According to the present invention, the second heat sink 300 does not have any single flow path, but has a plurality of flow paths (chemical liquid flow path tubes 310) with a given diameter, so that the efficiency in the heat transfer from the second heat sink 300 to the chemical liquid can be improved, thereby easily and conveniently performing the temperature control for the chemical liquid. If the single chemical liquid flow path is formed in the second heat sink like the conventional practice, in detail, the heat transfer efficiency may be gradually decreased toward the inner side of the single chemical liquid flow path with respect to the sectional area thereof in a flowing direction. According to the present invention, however, the plurality of chemical liquid flow paths, not the single chemical liquid flow path are formed in the second heat sink 300, and also, the sectional areas of the plurality of chemical liquid flow paths have given sizes, so that the heat of the second heat sink 300 can be transferred to the chemical liquid most efficiently.

According to the present invention, the second heat sink 300 includes a chemical liquid inlet tube 320, a chemical liquid outlet tube 330, the first and second heat sink blocks 340 and 350, and first to third manifold blocks 361, 362, and 363.

The chemical liquid inlet tube 320 is connected to the chemical liquid circulating and supplying tube 370 to thus form a flow path along which the chemical liquid flows to the plurality of chemical liquid flow path tubes 310. The chemical liquid outlet tube 330 is connected to the chemical liquid circulating and supplying tube 370 to thus form a flow path along which the chemical liquid discharged from the plurality of chemical liquid flow path tubes 310 flows to the chemical liquid circulating and supplying tube 370.

The first heat sink block 340 and the second heat sink block 350 are located on one side and the other side of the first heat sink 100 and have the plurality of chemical liquid flow path tubes 310 located at the insides thereof in such a manner as to communicate with the chemical liquid inlet tube 320 and the chemical liquid outlet tube 33.

According to the present invention, the second heat sink 300 is separable into the first heat sink block 340 and the second heat sink block 350, so that while the chemical liquid is flowing around the first heat sink 100, the chemical liquid continuously receives the heat from the first heat sink block 340 and the second heat sink block 350, thereby improving the heat exchange efficiency thereof.

As mentioned above, after the heat generated from the thermoelectric modules 200 is transferred to the first heat sink block 340 and the second heat sink block 350, it is transferred to the chemical liquid through the chemical liquid flow path tubes 310, and so as to increase the heat transfer efficiency between the first heat sink block 340 and the second heat sink block 350 and the chemical liquid flow path tubes 310, in this case, the outer peripheral surfaces of the chemical liquid flow path tubes 310 desirably come into close contact with the first heat sink block 340 and the second heat sink block 350.

Of course, after a plurality of through holes are formed on the first heat sink block 340 and the second heat sink block 35, the chemical liquid flow path tubes 310 are press-fitted to the through holes, but in the fitting process, the chemical liquid flow path tubes 310 may be undesirably broken.

According to the present invention, as shown in FIG. 4, the first heat sink block 340 includes an upper heat sink block piece 342 and a lower heat sink block piece 343, and the upper heat sink block piece 342 and the lower heat sink block piece 343 have semicircular insertion grooves 341. After the chemical liquid flow path tubes 310 are seated onto the insertion grooves 341 of any one block piece, accordingly, the other block piece is coupled to one block piece by means of bonding or screw fastening.

The first and second manifold blocks 361 and 362 are located on one side of the first and second heat sink blocks 340 and 350 in such a manner as to have internal flowing space therein and also accommodate the chemical liquid supplied to or discharged from the chemical liquid flow path tubes 310 thereinto in such a manner as to communicate with the chemical liquid inlet tube 320 and the chemical liquid outlet tube 330.

In detail, an end periphery of the chemical liquid inlet tube 320 is sealedly inserted into one side of the first manifold block 361, and the chemical liquid flow path tubes 310 are sealedly inserted into the other side of the first manifold block 361. Accordingly, the chemical liquid, which is introduced into the first manifold block 361 through the chemical liquid inlet tube 320, distributedly flows to the interiors of the chemical liquid flow path tubes 310. In more detail, the chemical liquid with a given flowing pressure flows to the interior of the first manifold block 361 through the chemical liquid circulating and supplying tube 370 and the chemical liquid inlet tube 320, so that the internal space of the first manifold block 361 is filled with the chemical liquid to allow the chemical liquid to distributedly flow to the chemical liquid flow path tubes 310 as uniform as possible by means of the negative pressure in the first manifold block 361.

Further, an end periphery of the chemical liquid outlet tube 330 is sealedly inserted into one side of the second manifold block 362, and the chemical liquid flow path tubes 310 are sealedly inserted into the other side of the second manifold block 362. Accordingly, the chemical liquid, which is introduced into the second manifold block 362 through the chemical liquid flow path tubes 310 after flowing to the interiors of the first and second heat sink blocks 340 and 350, is discharged through the chemical liquid outlet tube 330.

As shown in FIG. 5, the third manifold block 363 has an internal flowing space therein and is located on the other side of the first and second heat sink blocks 340 and 350 in such a manner as to allow the chemical liquid flow path tubes 310 arranged on the first and second heat sink blocks 340 and 350 to communicate with one another.

In detail, the end peripheries of the chemical liquid flow path tubes 310 arranged on the first and second heat sink blocks 340 and 350 are sealedly inserted into one side of the third manifold block 363. Accordingly, the chemical liquid, which is introduced through the chemical liquid inlet tube 320, flows to the first manifold block 361, the chemical liquid flow path tubes 310 of the first heat sink block 340, the third manifold block 363, the chemical liquid flow path tubes 310 of the second heat sink block 350, and the second manifold block 362 and is then discharged through the chemical liquid outlet tube 330. While the chemical liquid is being circulatedly moved, like this, it receives the heat generated from the thermoelectric modules 200 and is thus heated or cooled, so that it is changed in temperature and is then supplied to a next processing line.

According to the present invention, the chemical liquid flow path tubes 310 may be made of perfluoroalkoxy (PFA), and the first to third manifold blocks 361, 362, and 363 are made of polytetrafluoroethylene (PTFE).

As mentioned above, the chemical liquid flow path tubes 310 and the first to third manifold blocks 361, 362, and 363 actually come into direct contact with the chemical liquid, and accordingly, they are made of PFA and PTFE having good chemical resistances, thereby to the maximum preventing impurities from being produced due to chemical reactions occurring through the direct contacts with the chemical liquid.

So as to prevent the production of fine impurities, like this, the components coming into direct contact with the chemical liquid are made of PFA and PTFE, but since the PFA and PTFE have relatively low thermal conductivity, the heat transfer efficiency may be deteriorated.

As described above, however, the second heat sink 300 does not have any single flow path, but has the plurality of the chemical liquid flow path tubes 310 with the given diameter, so that the efficiency in the heat transfer from the second heat sink 300 to the chemical liquid can be improved, thereby overcoming the disadvantages the PFA and PTFE have had.

In addition to the structure where the heat transfer efficiency is increased, another structure in which the heat transfer efficiency in the chemical liquid flowing to the chemical liquid flow path tubes 310 of the second heat sink 300 can be raised is suggested.

In detail, as shown in FIGS. 7 to 10B, the second heat sink 300 further includes turbulent flow generating blocks 380 or 390 inserted into the end peripheries of the chemical liquid flow path tubes 310 to generate turbulent flows in the chemical liquid of the chemical liquid flow path tubes 310.

According to the present invention, the chemical liquid flow path tubes 310 are straight tubes that provide straight line flow paths, and as shown in FIGS. 6A and 6B, generally, a flow of a fluid in the interior of the straight tube is laminar. In this case, the heat transfer efficiency in the chemical liquid flowing to the chemical liquid flow path tubes 310 of the second heat sink 300 is more lowered than that in the turbulent flows.

According to the present invention, as shown in FIG. 7, the turbulent flows in the chemical liquid flow path tubes 310 are induced through the turbulent flow generating blocks 380, so that the heat generated from the second heat sink 300 can be uniformly transferred to the chemical liquid in the chemical liquid flow path tubes 310, thereby more increasing the heat exchange efficiency of the chemical liquid.

For example, as shown in FIGS. 7 to 9, each turbulent flow generating block 380 includes a turbulent flow generating block body 381 and a plurality of turbulent flow inducing paths 382 formed on the turbulent flow generating block body 381 in such a manner as to be inclined with respect to a longitudinal center axis of each chemical liquid flow path tube 310 to allow the chemical liquid to flow toward the inner peripheral surface of the chemical liquid flow path tube 310 to thus induce the turbulent flows caused by the collision with the inner peripheral surfaces of the chemical liquid flow path tube 310.

For another example, as shown in FIGS. 10A and 10B, each turbulent flow generating block 390 includes a turbulent flow generating block body 391 and a plurality of turbulent flow inducing paths 392 formed on the turbulent flow generating block body 391 in such a manner as to be gradually increased in a sectional area thereof toward the inner side of each chemical liquid flow path tube 310 to allow the chemical liquid to flow toward the inner peripheral surface of the chemical liquid flow path tube 310 to thus induce the turbulent flows caused by the collision with the inner peripheral surfaces of the chemical liquid flow path tube 310.

In case of both of the turbulent flow generating block 380 and the turbulent flow generating block 390, the turbulent flow inducing paths 382 and 392 are formed penetratedly into the turbulent flow generating block body 381 and the turbulent flow generating block body 391.

In addition, the turbulent flow inducing paths may be configured to have free structures wherein the turbulent flows can be generated. Even if not shown, the turbulent flow inducing paths may be formed curvedly at least one time, and in the same manner as above, in this case, the chemical liquid flows to the inner peripheries of the turbulent flow inducing paths toward the inner peripheral surface of the chemical liquid flow path tube 310.

In this case, the turbulent flow generating blocks 380 or 390 are press-fitted to the chemical liquid flow path tubes 310, and as shown in FIG. 9, they are located on a chemical liquid inlet side toward the interior of the first heat sink block 340 and on a chemical liquid inlet side toward the interior of the second heat sink block 350. Also, the turbulent flow generating blocks 380 or 390 come into direct contact with the chemical liquid, and in the same manner as above, accordingly, they are made of PFA or PTFE.

In addition to the turbulent flow generating blocks 380 or 390, another structure in which the heat transfer efficiency in the chemical liquid flowing to the chemical liquid flow path tubes 310 of the second heat sink 300 can be raised is suggested.

For example, as shown in FIG. 11A, each chemical liquid flow path tube 310 has protruding portions 311 and concave portions 312 repeatedly formed on the inner peripheral surface thereof along a circumferential direction thereof in such a manner as to be extended along a longitudinal direction thereof. Through the formation of the protruding portions 311 and the concave portions 312, heat exchange areas between the chemical liquid flow path tube 310 and the chemical liquid flowing therealong can be increased, thereby improving the heat exchange efficiency between the second heat sink 300 and the chemical liquid.

For other examples, as shown in FIGS. 11B and 11C, each chemical liquid flow path tube 310 has a plurality of partitioning bars 313 extendedly formed at the inside thereof along a longitudinal direction thereof in such a manner as to partition the flow path into a plurality of areas. Through the formation of the partitioning bars 313, heat exchange areas between the chemical liquid flow path tube 310 and the chemical liquid flowing therealong can be increased, thereby improving the heat exchange efficiency between the second heat sink 300 and the chemical liquid.

Even if not shown, in detail, the turbulent flow generating blocks 380 or 390 may be inserted into the chemical liquid flow path tubes 310 having the structures as shown in FIGS. 11A to 11C, and in this case, degrees of turbulent flows generated in the chemical liquid flow path tubes 310 can be more raised to thus upgrade the heat transfer efficiency. Through the formation of the portioning bars 313, especially, if the sectional area of each chemical liquid flow path tube 310 is partitioned into the plurality of small sectional areas, degrees of turbulent flows generated in the partitioned flow paths can be increased to the maximum.

As set forth in the foregoing, the temperature control device according to the present invention is provided with the second heat sink having the plurality of chemical liquid flow path tubes with the given diameter, not having a single flow path, so that the heat transfer efficiency from the second heat sink to the chemical liquid can be improved to thus control the temperature of the chemical liquid easily and efficiently.

In addition, the temperature control device according to the present invention is provided with the second heat sink having the first and second heat sink blocks, so that the chemical liquid receives heat multiple times, while flowing around the first heat sink, thereby more upgrading the heat exchange efficiency.

Further, the temperature control device according to the present invention inserts the turbulent flow generating blocks into the end peripheries of the chemical liquid flow path tubes and freely changes the internal structures of the chemical liquid flow path tubes, so that the heat transferred to the second heat sink can be more evenly transferred to the chemical liquid, thereby enhancing the heat exchange efficiency.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention. Therefore, it should be understood that the invention covers all the modifications, equivalents, and replacements within the idea and technical scope of the invention.

What is claimed is:

1. A temperature control device for a chemical liquid used in a semiconductor manufacturing process, which is located on a chemical liquid circulating and supplying tube to control a temperature of the chemical liquid, the device comprising:
a first heat sink having a cooling water flow path formed therein;
a plurality of thermoelectric modules coming into contact with both side surfaces of the first heat sink, respectively;
a second heat sink coming into contact with the thermoelectric modules, while placing the first heat sink between the thermoelectric modules, and having a plurality of chemical liquid flow path tubes adapted to flow the chemical liquid therealong;
wherein the second heat sink comprises:
a chemical liquid inlet tube adapted to introduce the chemical liquid thereinto and a chemical liquid outlet tube adapted to discharge the chemical liquid therefrom;
first and second heat sink blocks located on one side and the other side of the first heat sink and having the plurality of chemical liquid flow path tubes located at the insides thereof in such a manner as to communicate with the chemical liquid inlet tube and the chemical liquid outlet tube;
first and second manifold blocks located on one side of the first and second heat sink blocks, having internal flowing space therein to accommodate the chemical liquid supplied to or discharged from the chemical liquid flow path tubes thereinto, and communicating with the chemical liquid inlet tube and the chemical liquid outlet tube;
a third manifold block located on the other side of the first and second heat sink blocks, having an internal flowing space therein, and allowing the plurality of chemical liquid flow path tubes arranged on the first and second heat sink blocks to communicate with one another; and
turbulent flow generating blocks each having a turbulent flow generating block body inserted into the end peripheries of the plurality of chemical liquid flow path tubes to generate turbulent flows in the chemical liquid of the plurality of chemical liquid flow path tubes.

2. The temperature control device of claim 1, wherein the plurality of chemical liquid flow path tubes are made of perfluoroalkoxy (PFA), the first and second heat sinks are made of an aluminum alloy, and the first to third manifold blocks are made of polytetrafluoroethylene (PTFE).

3. The temperature control device of claim 1, wherein the plurality of chemical liquid flow path tubes have the shape of a straight tube, and each turbulent flow generating block comprises:
a plurality of turbulent flow inducing paths formed on the turbulent flow generating block body in such a manner as to be inclined with respect to a longitudinal center axis of each chemical liquid flow path tube to allow the chemical liquid to flow toward the inner peripheral surface of the chemical liquid flow path tube to thus induce the turbulent flows caused by the collision with the inner peripheral surfaces of the chemical liquid flow path tube.

4. The temperature control device of claim 1, wherein the plurality of chemical liquid flow path tubes have the shape of a straight tube, and each turbulent flow generating block comprises:
a plurality of turbulent flow inducing paths formed on the turbulent flow generating block body in such a manner as to be gradually increased in a sectional area thereof toward the inner side of each chemical liquid flow path tube to allow the chemical liquid to flow toward the inner peripheral surface of the chemical liquid flow path tube to thus induce the turbulent flows caused by the collision with the inner peripheral surfaces of the chemical liquid flow path tube.

5. The temperature control device of claim 1, wherein the turbulent flow generating blocks are made of PFA or PTFE.

6. The temperature control device of claim 1, wherein each chemical liquid flow path tube has protruding portions and concave portions repeatedly formed on the inner peripheral surface thereof along a circumferential direction thereof in such a manner as to be extended along a longitudinal direction thereof.

7. The temperature control device of claim 6, wherein each chemical liquid flow path tube has a plurality of partitioning bars extendedly formed at the inside thereof along a longitudinal direction thereof in such a manner as to partition the flow path into a plurality of areas.

\* \* \* \* \*